United States Patent
Teng et al.

(10) Patent No.: US 12,426,183 B2
(45) Date of Patent: Sep. 23, 2025

(54) ADJUSTABLE AND CHANGEABLE MODULAR CONTROL PANEL

(71) Applicant: ELGATO IDISPLAY LIMITED, New Taipei (TW)

(72) Inventors: Wei-Hao Teng, New Taipei (TW); Ming-Hung Wang, New Taipei (TW)

(73) Assignee: ELGATO IDISPLAY LIMITED, New Taipei (TW)

( * ) Notice: Subject to any disclaimer, the term of this patent is extended or adjusted under 35 U.S.C. 154(b) by 171 days.

(21) Appl. No.: 18/399,596

(22) Filed: Dec. 28, 2023

(65) Prior Publication Data
US 2025/0081371 A1    Mar. 6, 2025

(30) Foreign Application Priority Data
Aug. 29, 2023 (TW) ................................. 112132438

(51) Int. Cl.
*H05K 5/02* (2006.01)

(52) U.S. Cl.
CPC ......... *H05K 5/0256* (2013.01); *H05K 5/0247* (2013.01)

(58) Field of Classification Search
None
See application file for complete search history.

(56) References Cited

U.S. PATENT DOCUMENTS

| | | | |
|---|---|---|---|
| 6,475,036 B2 * | 11/2002 | Morikawa ............ | H05K 7/1468 439/716 |
| 6,619,836 B1 * | 9/2003 | Silvant .................... | G04G 17/08 368/282 |
| 6,881,101 B2 | 4/2005 | Sichner et al. | |
| 7,021,974 B2 * | 4/2006 | Sichner .................... | H05K 5/30 439/732 |
| 7,332,681 B2 * | 2/2008 | Wohlfart ............ | H01H 13/7006 200/345 |

(Continued)

FOREIGN PATENT DOCUMENTS

| | | |
|---|---|---|
| DE | 102012204127 A1 | 7/2013 |
| DE | 202018103348 U1 | 8/2018 |

(Continued)

*Primary Examiner* — Xanthia C Relford
*Assistant Examiner* — Xanthia C Cunningham
(74) *Attorney, Agent, or Firm* — Li & Cai Intellectual Property Office (57) ABSTRACT

An adjustable and changeable modular control panel includes a supporting dock, and at least one control unit. The supporting dock includes a main connecting member, and a plurality of receiving areas. Each of the receiving areas has a first connector, and a plurality of first positioning portions. The first connector of the receiving area is electrically connected to the main connecting member. The at least one control unit is mated with one of the receiving areas. Each of the control units has a control switch on its top side. The bottom side of each of the control units has a second connector, and a plurality of second positioning portions. The control switch is electrically connected to the second connector. The second connector is selectively mated with the first connector. The second positioning portions can be correspondingly located on the first positioning portions.

9 Claims, 5 Drawing Sheets

(56) References Cited

U.S. PATENT DOCUMENTS

| | | | |
|---|---|---|---|
| 7,503,790 B2* | 3/2009 | Bodmann | H05K 5/061 439/271 |
| 8,074,680 B2* | 12/2011 | De Carolis | F15B 13/0857 439/717 |
| 8,371,894 B1* | 2/2013 | Rosen | A63H 33/108 446/485 |
| 10,026,569 B2* | 7/2018 | Danowski | H01H 13/705 |
| 10,592,004 B1* | 3/2020 | Sun | H01H 13/83 |
| 10,855,059 B2* | 12/2020 | Valsecchi | H01R 25/161 |
| 10,886,051 B2* | 1/2021 | Osipov | A63F 9/24 |
| 10,899,474 B1* | 1/2021 | Misso, III | B64U 80/25 |
| 11,294,476 B1 | 4/2022 | Wuu et al. | |
| 11,330,714 B2* | 5/2022 | Bdeir | H05K 1/18 |
| 11,510,324 B2* | 11/2022 | Osipov | H05K 5/30 |
| 11,545,316 B2* | 1/2023 | Nakamura | H01H 13/705 |
| 11,921,471 B2* | 3/2024 | Bailey | G04G 21/08 |
| 2005/0264521 A1 | 12/2005 | Liu et al. | |
| 2006/0134978 A1* | 6/2006 | Rosen | H01R 13/514 439/581 |
| 2007/0012550 A1* | 1/2007 | Wohlfart | H01H 13/7006 200/18 |
| 2007/0279852 A1* | 12/2007 | Daniel | H04B 1/385 361/728 |
| 2011/0048909 A1* | 3/2011 | Clark | H01H 13/063 200/330 |
| 2017/0256883 A1* | 9/2017 | Kim | H01R 9/2458 |
| 2021/0083436 A1 | 3/2021 | King | |

FOREIGN PATENT DOCUMENTS

| | | |
|---|---|---|
| JP | 62229421 A | 10/1987 |
| TW | 200538997 A | 12/2005 |
| TW | 202213039 A | 4/2022 |

* cited by examiner

FIG. 5

ADJUSTABLE AND CHANGEABLE MODULAR CONTROL PANEL

CROSS-REFERENCE TO RELATED PATENT APPLICATION

This application claims the benefit of priorities to Taiwan Patent Application No. 112132438, filed on Aug. 29, 2023. The entire content of each of the above identified applications is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an adjustable and changeable modular control panel, and more particularly to a modular control panel including a plurality of adjustable and changeable control units for flexible allocation of different control functions.

BACKGROUND OF THE DISCLOSURE

In order to conveniently control various conditions in similar scenarios, such as the pickup status of a microphone, the volume of speakers, or what is shown on a screen of a display, multiple controllers are usually integrated into the same central control panel. The locations of various control units on a conventional central control panel, such as buttons, knobs, lights, or slide rails, etc., are usually fixed.

When additional control items need to be added in the same occasion, such as adding light sources or speakers, or adjusting other items that require different controls, the conventional central control panel lacks the flexibility to adapt. A cluttered control desktop is usually the result of additional control units being set up, while replacing the entire central control panel is not environmentally friendly and costs a lot of money.

Therefore, how to improve the flexibility of adjusting and replacing the control panel internal through an improvement in structural design to overcome the above-mentioned problems, and to further provide a customizable central control panel for a user, has become one of the important issues to be addressed in the relevant art.

SUMMARY OF THE DISCLOSURE

In response to the above-referenced technical inadequacies, the present disclosure provides an adjustable and changeable modular control panel to solve the above-mentioned problems.

In order to solve the above-mentioned problems, one of the technical aspects adopted by the present disclosure is to provide an adjustable and changeable modular control panel, which includes a supporting dock and at least one control unit. The supporting dock includes a main connecting member, and a plurality of receiving areas. Each of the receiving areas has a first connector, and a plurality of first positioning portions. The first connector of each of the receiving areas is electrically connected to the main connecting member. The at least one control unit is mated with one of the receiving areas. A top surface of each control unit has a control switch. Each bottom surface of the control unit has a second connector, and a plurality of second positioning portions. The control switch is electrically connected to the second connector. The second connector is selectively mated with the first connector. The second positioning portions are able to be fixed in position at the first positioning portions.

Therefore, in the adjustable and changeable modular control panel provided by the present disclosure, by the second connector of the control units being selectively mated with any one of the first connectors of the supporting dock, the control units could be rotated to different angles, such that the control units can be adjusted or replaced, so as to enhance the adjustability and expandability of the modular control panel.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 5, an embodiment of the present disclosure provides an adjustable and changeable modular control panel, which includes a supporting dock 10 and a plurality of control units 20a, 20b, 20c, 20d. In this embodiment, the supporting dock 10 has the function of a USB hub, which can connect the control units 20a, 20b, 20c, and 20d to a USB host (not shown). The control units 20a, 20b, 20c, 20d can be movable small controllers, each having a connector compatible with the USB interface, so as to connect the supporting dock 10, respectively.

Figure 2:
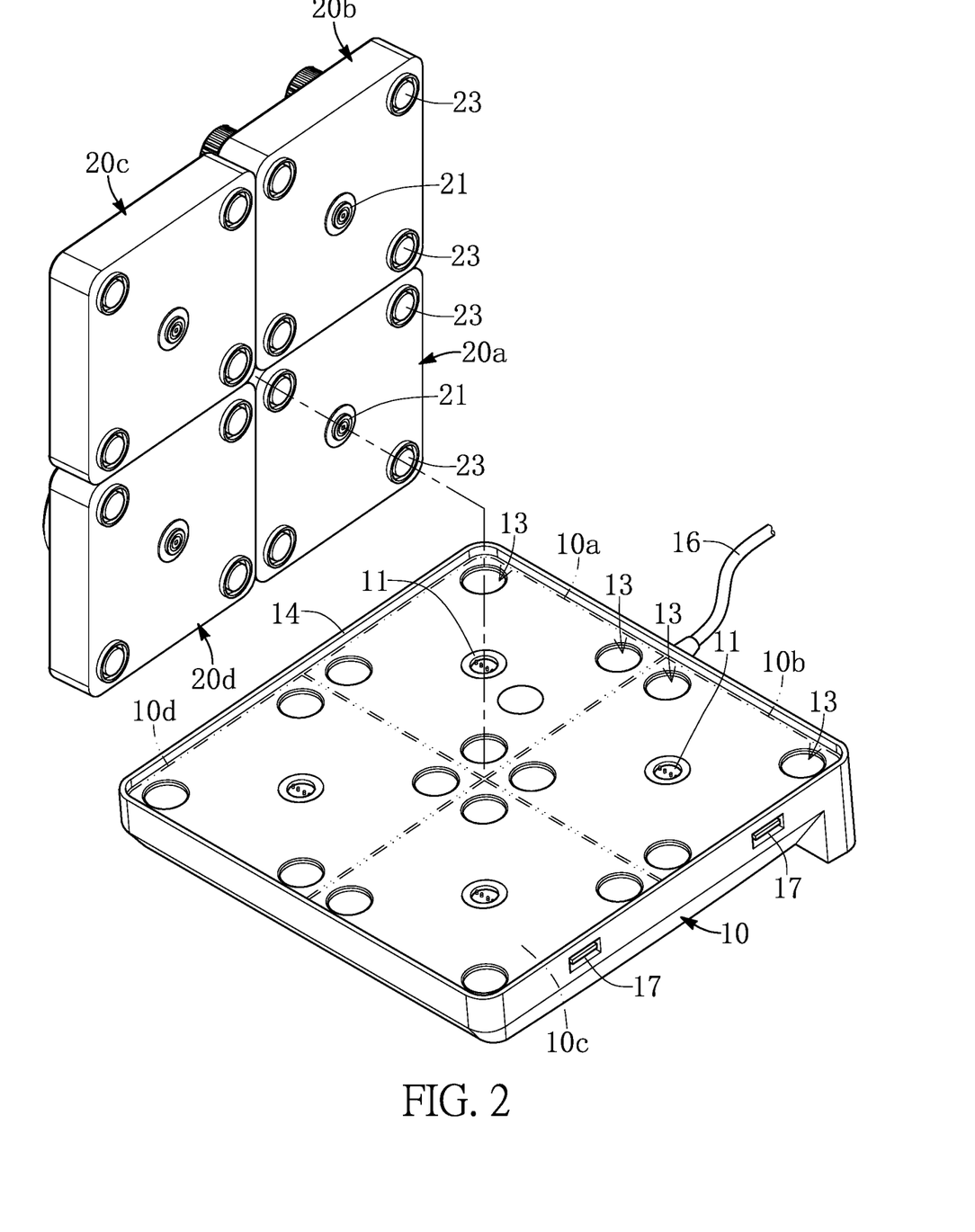
FIG. 2 is a schematic exploded view of the adjustable and changeable modular control panel according to the present disclosure.
Figure 3:
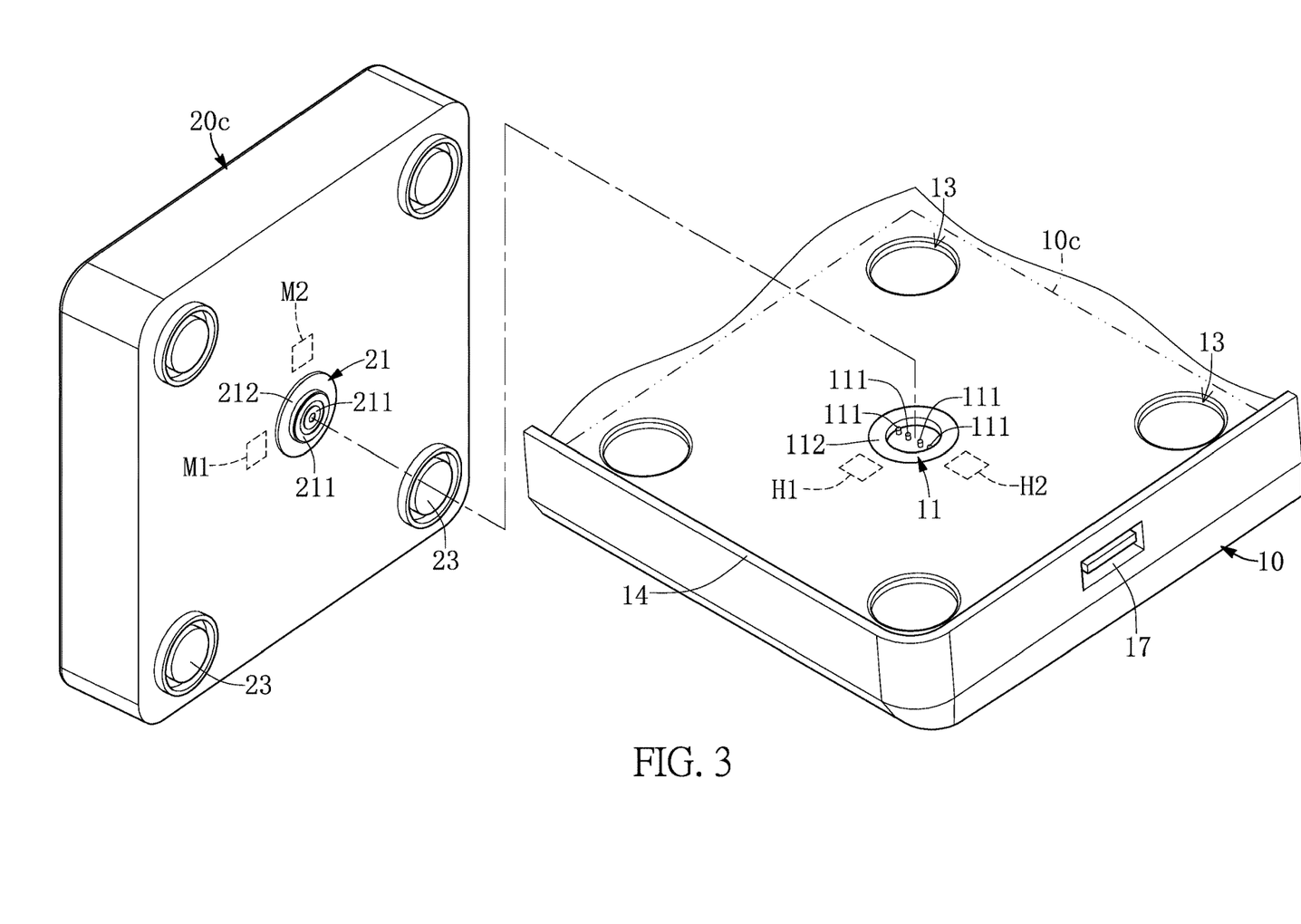
FIG. 3 is a partially-enlarged view of FIG. 2.

Referring to FIG. 2 and FIG. 3, the supporting dock 10 includes a main connecting member 16, and a plurality of receiving areas 10a, 10b, 10c, 10d. The main connecting member 16 can be used to connect with the USB host (not shown), for example, a USB controller of a computer or an electronic device. In this embodiment, the main connecting member 16 can be a cable for connecting outward. However, the present disclosure is not limited thereto. The main connecting member 16 also can be a connector for connecting outward, such as a USB connector, and is connected to a USB Host (not shown) by a cable. The supporting dock 10 has an upper surface that is formed in a slanted manner. A periphery of the supporting dock 10 has a blocking wall 14. The blocking wall 14 is encircled to form a plurality of receiving areas 10a, 10b, 10c, 10d. In this embodiment, each of the receiving areas 10a, 10b, 10c, 10d have the same configuration. For example, the receiving area 10a includes a first connector 11, and a plurality of first positioning portions 13. The first connector 11 of each of the receiving areas 10a, 10b, 10c, 10d is electrically connected to the main connecting member 16. The details of the first connector 11 will be given later with examples. In this embodiment, the first positioning portion 13 is concaved in a circle shape and can be used as a positioning hole.

More specifically, a periphery of the supporting dock 10 can be equipped with at least one serial connector 17, such as a standard USB connector, so that it can connect another supporting dock 10 or a control unit. Therefore, the modular control panel of the present disclosure has expandability. In addition, the shape which is encircled by the blocking wall 14 of the supporting dock 10 is not limited to being a square, and can be, for example, rectangle-shaped. In other words, it can receive four control units 20a, 20b, 20c, 20d in a serial manner.

The control units 20a, 20b, 20c, 20d are mated with the receiving areas 10a, 10b, 10c, 10d in an one-to-one manner. In this embodiment, the control units 20a, 20b, 20c, 20d are rectangular-shaped. Preferably, they can be square-shaped, and their four sides can be adjacent to each other. The control units can be, such as key button panels, slider button panels, rotatory button panels, small display panels, or joy-stick panels . . . , etc. However, the present disclosure is not limited to the above examples.

Each top surface of the control units 20a, 20b, 20c, 20d has a control switch 22a, 22b, 22c, 22d, such as a key button, a small rotary button, a linear push button, or a larger rotary button . . . etc. However, the present disclosure is not limited thereto. Each bottom surface of the control units 20a, 20b, 20c, 20d has the same structure. Taking the control unit 20c as an example, the control unit 20c has a second connector 21, and a plurality of second positioning portions 23. The control switch 22c of the control unit 20c is electrically connected to the second connector 21. By the second connector 21 being mated with the first connector 11, controlling signals of the control switch 22c can be output outward by the main connecting member 16 of the supporting dock 10. In this embodiment, the second positioning portions 23 are protruded in circular shapes, which can be respectively orientated toward the first positioning portions 13. Therefore, the control units 20a, 20b, 20c, 20d are respectively fixed in position at the receiving areas 10a, 10b, 10c, 10d.

One of the characteristics of the present disclosure is that any one of the control units (20a, 20b, 20c, 20d) can be rotated to different directions, and is adjustably disposed in any one of the receiving areas (10a, 10b, 10c, 10d). More specifically, in order to cooperate with the above structural configurations, the second connector 21 is located at a center of the bottom surface of the control units (20a, 20b, 20c, 20d). In this embodiment, the bottom surfaces of the control units (20a, 20b, 20c, 20d) substantially have a rectangular shape. The second connector 21 is located at a geometric center of the bottom surface of the control units, that is, at an intersection of two diagonal lines. The first positioning portions 13 of each of the receiving areas (10a, 10b, 10c, 10d) are concaved-shaped, and distributed at four corners of the bottom surface of the control units (20a, 20b, 20c, 20d). The second positioning portion 23 is in a convex shape. The shape of the second positioning portion 23 corresponds with the shape of the first positioning portions 13. However, the above example is just one practical embodiment, and is not limited to the present disclosure. The bottom surface of the control units is not limited to being rectangular in shape. For example, the control units can be have a circular shape, and the second connector 21 located at a center of the circular control unit. Furthermore, the control units can include two rectangular items, such as rectangle-shaped, diamond-shaped, L-shaped, or T-shaped items. Similar to toy bricks of different shapes, they can be spliced (i.e., connected) with each other. The second connector on the bottom surface of the control units is not limited to being one in quantity, and the quantity can be more than one.

More specifically, the first connector 11 has a plurality of flexible terminals 111 in a linear arrangement. For example, the flexible terminals 111 can be pogo pins. The second connector 21 is circular-shaped, and has a plurality of conductive contact rings 211. The contact rings 211 are ranged in a ring-shaped and concentric manner. The flexible terminals 111 are arranged linearly, and respectively contact the contact rings 211. Therefore, the control units (20a, 20b, 20c, 20d) can be mated with the receiving areas (10a, 10b, 10c, 10d) in different directions.

In this embodiment, there are four flexible terminals 111, which are a power contact for electricity supply, a pair of signal contacts of differential signals, and a ground contact for grounding, which can be compatible with the USB interface.

Correspondingly, the second connector 21 of this embodiment includes four contact rings 211 with different diameters, being one central circular ring and three annular-shaped rings. The four contact rings 211 are a power ring for supplying electricity, a pair of signal rings for transmitting differential signals, and a grounding ring for grounding, respectively.

In one embodiment, the first connector 11 further includes a first magnetic ring 112. The first magnetic ring 112 encircles the plurality of flexible terminals 111. In addition, the second connector 21 further includes a second magnetic ring 212. The second magnetic ring 212 encircles the plurality of contact rings 211. The first magnetic ring 112 can attract the second magnetic ring 212. The magnetic rings can be made of magnetic material or materials that are capable of being magnetically attracted. Through the above-mentioned two magnetic rings, magnetic forces are provided to the control units (20a, 20b, 20c, 20d), so as to fix the receiving areas (10a, 10b, 10c, 10d).

For additional information, each of the receiving areas (10a, 10b, 10c, 10d) in the supporting dock 10 could have at least one Hall sensor H1. The bottom surfaces of the control units (20a, 20b, 20c, 20d) can be equipped with at least one positioning magnet M1. The Hall sensor H1 can detect a variation of magnetic field of the positioning magnet M1 through the Hall effect. In one embodiment, each of the receiving areas has two Hall sensors H1, H2 that are located with an included angle of 90 degrees on a circumference of a circle formed around a center of the first connector 11. The control units have two positioning magnets M1, M2 that are located with an included angle of 90 degrees on a circumference of a circle formed around a center of the second connector 21. Therefore, when the control units (20a, 20b, 20c, and 20d) are rotated in different angles, the two hall sensors H1, H2 and the two positioning magnets M1, M2 can detect four states. For example, two positioning magnets M1, M2 are detected, or only one of the positioning magnets M1 (or M2) is detected, or none of the positioning magnets is detected, so as to represent four different angles of the control units (20a, 20b, 20c, 20d). In other words, the supporting dock 10 can detect which angle/direction each of the control units (20a, 20b, 20c, 20d) is located.

Figure 1:
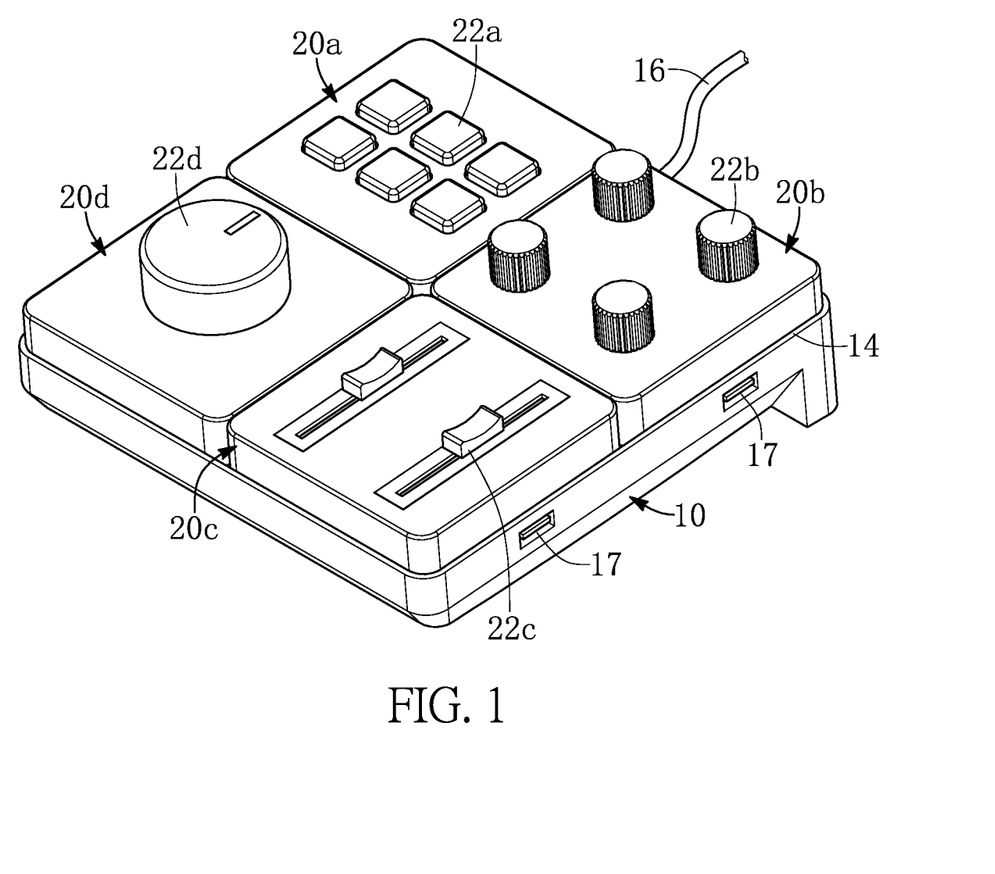
FIG. 1 is a schematic perspective assembled view of an adjustable and changeable modular control panel according to the present disclosure.
Figure 4:
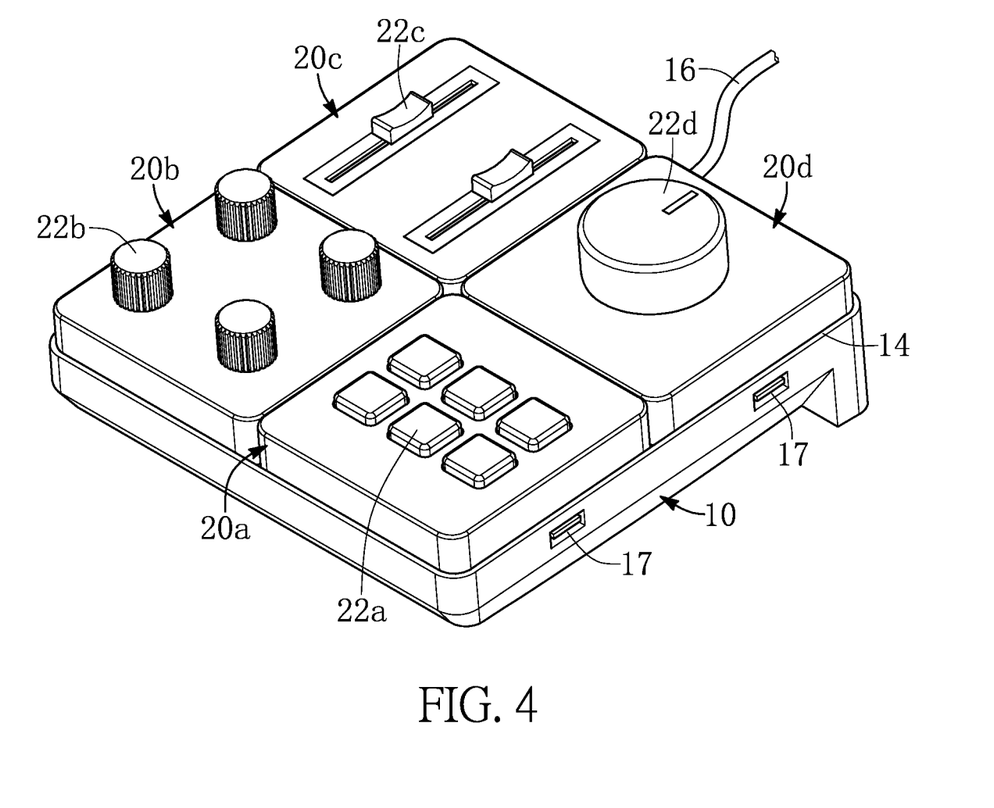
FIG. 4 is schematic perspective assembled view of the adjustable and changeable modular control panel of FIG. 1 in another configuration.
Figure 5:
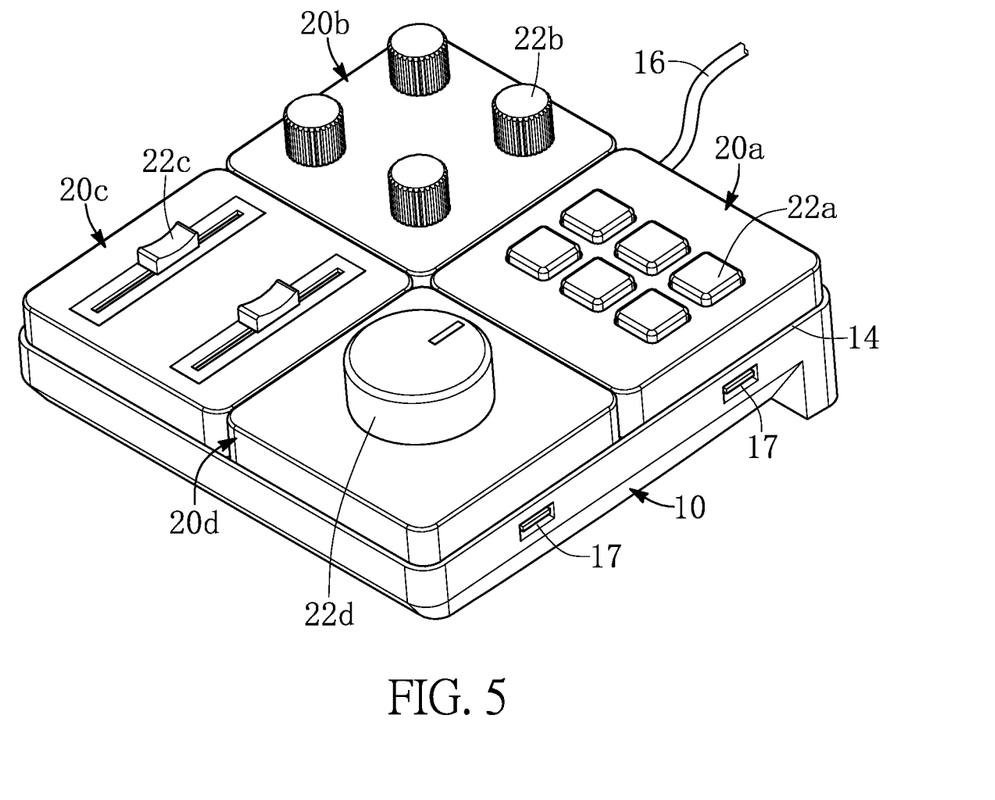
FIG. 5 is schematic perspective assembled view of the adjustable and changeable modular control panel of FIG. 1 in yet another configuration.

Referring to FIG. 4 and FIG. 5, the control units (20a, 20b, 20c, 20d) are located at different positions of the supporting dock 10 related to that of FIG. 1 and FIG. 4. The control units (20a, 20b, 20c, 20d) in FIG. 5 are also able to be changed at different positions of the supporting dock 10.

Beneficial Effects of the Embodiments

In conclusion, one of the beneficial effects of the present disclosure is that, in the adjustable and changeable modular control panel provided by the present disclosure, by the second connector of the control units being selectively mated with any one of the first connectors of the supporting dock, the control units can be rotated to different angles, such that the control units can be adjusted or replaced, so as to enhance the adjustability and expandability of the modular control panel.

Further, different users can purchase different control units according to their requirements, or replace the control units, or expand the control units, so as to control the volume, light, microphone . . . , etc. Even the modular control panel can be customized according to practical requirements.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An adjustable and changeable modular control panel, comprising:
   a supporting dock including a main connecting member and a plurality of receiving areas, each of the receiving areas having a first connector and a plurality of first positioning portions, and the first connector of each of the receiving areas being electrically connected to the main connecting member; and
   at least one control unit mating with one of the receiving areas, wherein each of the at least one control unit has a control switch on a top surface thereof, and each of the at least one control unit has a second connector on a bottom surface thereof and a plurality of second positioning portions, and wherein the control switch is electrically connected to the second connector, the second connector is selectively mated with the first connector, and the second positioning portions are able to be positioned at the plurality of first positioning portions.

2. The adjustable and changeable modular control panel according to claim 1, wherein an upper surface of the supporting dock is inclined, and a blocking wall is arranged at a periphery of the supporting dock.

3. The adjustable and changeable modular control panel according to claim 1, wherein the second connector is located at a center of the bottom surface of the control unit.

4. The adjustable and changeable modular control panel according to claim 3, wherein the first positioning portions of each of the receiving areas are concaved, and are arranged at corners of the bottom surface of the control unit; wherein the second positioning portions are protrusions, and a shape of the second positioning portions complements a shape of the first positioning portions for mating with each other.

5. The adjustable and changeable modular control panel according to claim 1, wherein the first connector includes a plurality of flexible terminals, the second connector is round, and has a plurality of contact rings, the contact rings are annular in shape and arranged in a concentric manner, the flexible terminals are in contact with the contact rings, respectively, such that the control unit can be mated with the receiving areas in a different direction.

6. The adjustable and changeable modular control panel according to claim 5, wherein the first connector includes four of the flexible terminals, which are a power-supply, a pair of differential signals, and a grounding signal, respectively.

7. The adjustable and changeable modular control panel according to claim 5, wherein the first connector further includes a first magnetic ring, the first magnetic ring surrounds the flexible terminals, the second connector further includes a second magnetic ring, the second magnetic ring surrounds the contact rings, and the first magnetic ring is configured to attract the second magnetic ring.

8. The adjustable and changeable modular control panel according to claim 1, wherein each of the receiving areas of the supporting dock further includes at least one Hall sensor, a bottom surface of the control unit includes at least one positioning magnet, and the at least one Hall sensor is configured to detect a variation of a magnetic field of the at least one positioning magnet.

9. The adjustable and changeable modular control panel according to claim 1, wherein each one of the receiving areas has two Hall sensors located with an included angle of 90 degrees on a circumference of a circle formed around a center of the first connector, the control unit has two positioning magnets located with an included angle of 90 degrees on a circumference of a circle formed around a center of the second connector, such that two of the hall sensors and two of the positioning magnets are capable of sensing different states when the control unit is rotated to different angles.

* * * * *